United States Patent [19]
Cho et al.

[11] Patent Number: 5,849,619
[45] Date of Patent: Dec. 15, 1998

[54] METHOD FOR FORMATION OF CAPACITORS

[75] Inventors: Won-Ju Cho; Wouns Yang, both of Cheongju-si, Rep. of Korea

[73] Assignee: LG Semicon Co., Ltd., Chungcheongbuk-do, Rep. of Korea

[21] Appl. No.: 769,627

[22] Filed: Dec. 18, 1996

[30] Foreign Application Priority Data

Dec. 19, 1995 [KR] Rep. of Korea ................ 1995 51930

[51] Int. Cl.$^6$ ...................... H01L 21/8242; H01L 21/20
[52] U.S. Cl. ........................................ 438/254; 438/397
[58] Field of Search .................................... 438/238, 239, 438/253, 254, 255, 381, 396, 397, 398; 257/306, 309

[56] References Cited

U.S. PATENT DOCUMENTS

| | | | |
|---|---|---|---|
| 5,429,972 | 7/1995 | Anjum et al. | 438/238 |
| 5,688,726 | 11/1997 | Kim | 438/254 |
| 5,726,086 | 3/1998 | Wu | 438/238 |

OTHER PUBLICATIONS

"A Stacked Capacitor Cell with Ring Structures," Shinmura et al., *Extended Abstracts of 22nd* (1990 *International*) *Conference on Solid State Devices and Materials*, 1990, pp. 833–836.

Crown–Shaped Stacked–Capacitor Cell for 1.5–V Operation 64–Mb DRAMs, Toru Kaga et al., *IEEE Transactions on Electron Devices*, vol. 38, No. 2, Feb. 1991, pp. 255–260.

Primary Examiner—Joni Chang

[57] ABSTRACT

A method of forming a capacitor for a DRAM includes the steps of: forming an insulating layer with a contact hole on a substrate; forming a first conductive layer on the insulating layer and in the contact hole; forming a temporary layer pattern on a portion of the first conductive layer corresponding to the contact hole; forming a second conductive layer on the first conductive layer and on the temporary layer pattern; selectively implanting oxygen ions into the first and second conductive layers except a portion of the second conductive layer corresponding to a side face of the temporary layer pattern; heat treating so as to convert the oxygen-ion-implanted first and second conductive layer portions into an oxide; removing the oxide and temporary layer pattern; forming a dielectric layer on the surface of the first and second conductive layers; and forming a third conductive layer on the dielectric layer.

13 Claims, 7 Drawing Sheets

METHOD FOR FORMATION OF CAPACITORS

FIELD OF THE INVENTION

The present invention relates to a method for making a capacitor in a semiconductor device, particularly to a method for forming a capacitor in a DRAM, which improves the reliability of the device.

BACKGROUND OF THE INVENTION

FIGS. 1A–1E are partial sectional views of the capacitor portion showing the major steps of the capacitor forming process according to the conventional semiconductor memory manufacturing method.

Referring to this drawing, the conventional method and the accompanying problems will be described below.

Figure 1A:
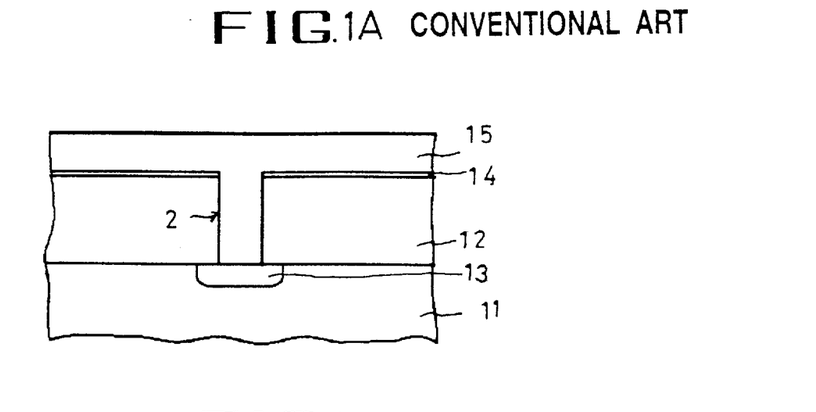
FIGS. 1A–1E illustrate the conventional process for formation of a capacitor.

First, as shown in FIG. 1A, an impurity diffusion region 13 is formed in a substrate 11, and then, an oxide layer 12 and a nitride layer 14 are successively deposited thereupon.

Then a mask pattern is formed upon the nitride layer to define a node contact. Then, the nitride layer is etched by utilizing the mask pattern.

Then, by using the nitride layer as a mask, the oxide layer 12 is etched to form a contact hole 2.

Then, polysilicon to be used as an electrode is deposited on the nitride layer 14 and in the contact hole 2, thereby forming a conductive layer 15.

Figure 1B:
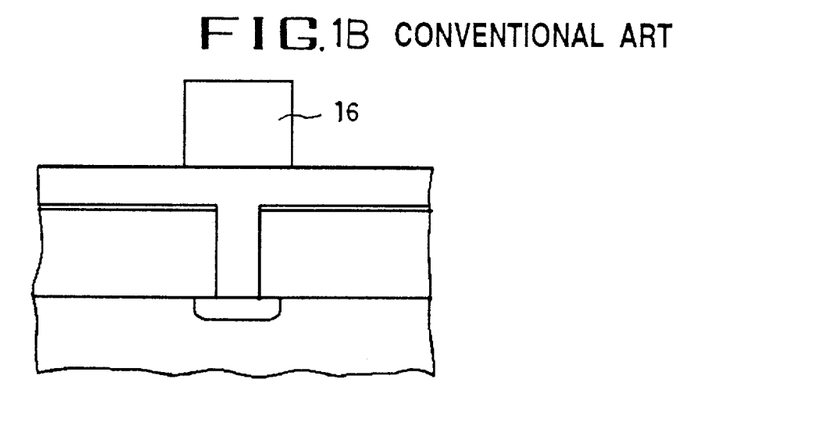

Then, as shown in FIG. 1B, an oxide layer is deposited upon the polysilicon layer, and then, a mask pattern is formed on the oxide layer. Then a part of the oxide layer is etched so as to form a temporary layer pattern 16. This temporary layer pattern will serve at a subsequent process step as a frame over which will be formed a storage electrode of the capacitor.

Figure 1C:
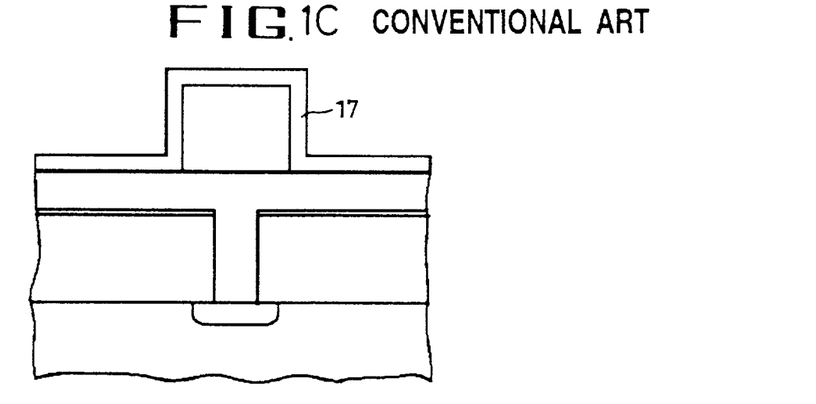

Then, as shown in FIG. 1C, polysilicon is deposited on the entire surface of the conductive layer 15, thereby forming a conductive layer 17.

Figure 1D:
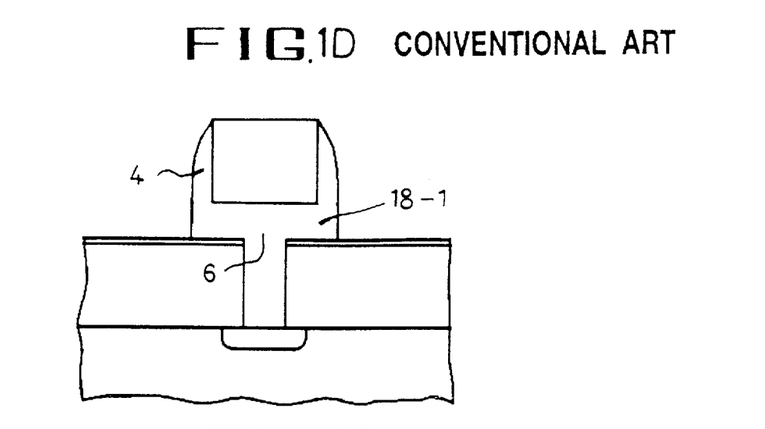

Then, as shown in FIG. 1D, the conductive layers 15 are 17 are dry-etched without using a mask so as to form a storage electrode 18-1 of the capacitor. The storage electrode 18-1 has a cylindrical portion 4 having a tapered upper end and a contact pole 6 lying below the cylindrical portion 4.

As a result of such etch-backs, the polysilicon layer which lies between the upper polysilicon layer and another adjacent electrode is removed, with the result that an electrode portion corresponding to a unit cell is formed.

Figure 1E:
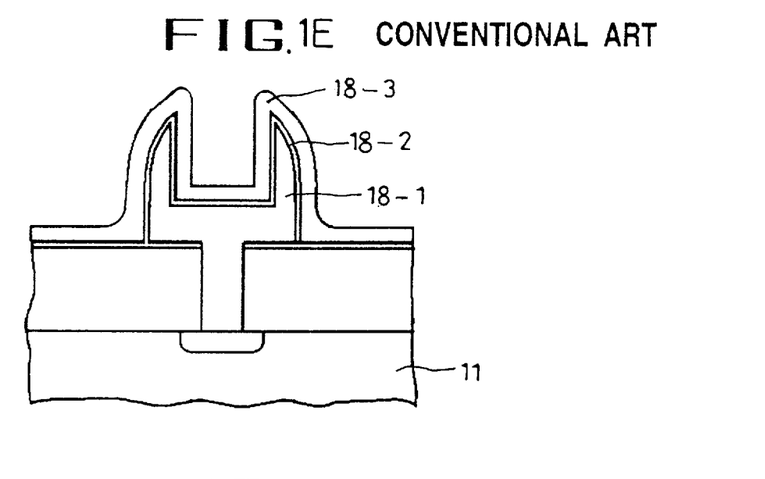

Finally as shown in FIG. 1E, the temporary layer pattern 16 is removed, and then, a dielectric layer 18-2 is formed on the surface thereof. Then polysilicon is deposited to form a storage electrode 18-3, thereby completing the formation of the capacitor.

In the above described conventional technique, a cylindrical capacitor is formed by using a dry etching. However, when forming the storage electrode of the cylindrical capacitor based on the dry etching process, the leading end portion becomes tapered. In the tapered portion of the storage electrode, the electric field is intensively concentrated and the dielectric formed thereagainst is stressed and is of non-uniform thickness. As a result, the dielectric tends to degrade, and a leakage current tends to increase, at the tapered portion. Consequently, the memory capacity is partially lost, thereby degrading the product reliability.

Particularly, in accordance with the increase of the density of the memory device, it is necessary to use a dielectric layer having a high dielectric constant. However, the dielectric constant is inversely proportional to the voltage breakdown strength. Therefore the sharp angled portion which is formed on the top of the node electrode becomes problematic in using a high dielectric constant material.

SUMMARY OF THE INVENTION

The present invention is intended to overcome the above described disadvantages of the conventional technique.

Therefore, it is an object of the present invention to provide a method for formation of a capacitor, in which the leading end of the cylindrical storage electrode is provided with a non-tapered form. The method is particularly well suited to the production of DRAMs of increasingly high density.

The objects of the present invention are achieved, e.g., as follows. An oxygen ion implanting process is carried out, and thus, the conductive layer which is to become the storage electrode of the cylindrical capacitor is converted to an oxide layer. Then the oxide layer is removed so as to form a storage electrode having a non-tapered, e.g., rounded, leading end portions, thereby improving the reliability of the product.

It is another object of the present invention to provide a method for formation of a capacitor, in which the capacitor can be formed in an easy manner.

It is still another object of the present invention to provide a method for formation of a capacitor, in which the formation of a tapered leading end portion is inhibited, thereby improving the reliability of the semiconductor device.

In achieving the above objects, the method for formation of a capacitor according to the present invention includes the steps of: forming an insulating layer with a contact hole on a substrate; forming a first conductive layer on the insulating layer and in the contact hole; forming a temporary layer pattern on a portion of the first conductive layer corresponding to the contract hole; forming a second conductive layer on the first conductive layer and on the temporary layer pattern; selectively implanting oxygen ions into the first and second conductive layers except a portion of the second conductive layer corresponding to a side face of the temporary layer pattern; heat treating so as to convert the oxygen-ion-implanted first and second conductive layers into an oxide; removing the oxide and the temporary layer pattern; forming a dielectric layer on the surface of the first and second conductive layers; and forming a third conductive layer on the dielectric layer.

In another aspect of the present invention, the method for formation of a capacitor according to the present invention includes the steps of: forming an insulating layer with a contact hole on a substrate; forming a first conductive layer on the insulating layer and in the contact hole; forming a temporary layer pattern on a portion of the first conductive layer corresponding to the contact hole; forming a second conductive layer on the first conductive layer and on the temporary layer pattern; forming a temporary sidewall spacer on a sidewall of the second conductive layer corresponding to a side face of the temporary layer patter; selectively implanting oxygen ions into the exposed portions of the second conductive layer and into the first conductive layer lying thereunder respectively; heat treating so as to convert the oxygen-ion-implanted first and second conductive layers into an oxide; and removing the oxide and the temporary layer pattern; forming a dielectric layer on the surface of the first and second conductive layers; and forming a third conductive layer on the dielectric layer.

The oxygen ion implantation is carried out in a vacuum with such a force that the oxygen ions can reach the first conductive layer after passing through the second conductive layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

FIGS. 2A–2F are sectional views showing a first embodiment of the method for formation of a capacitor according to the present invention.

The first embodiment of the present invention will be described referring to FIGS. 2A–2F.

Figure 2A:
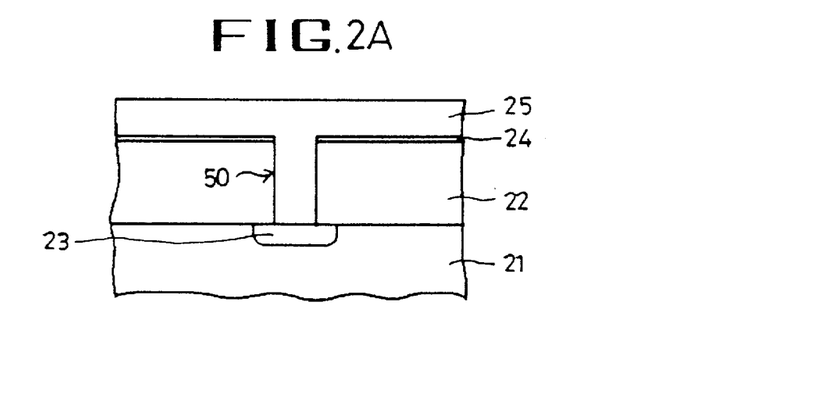
FIGS. 2A–2F are sectional views showing a first embodiment of the method for formation of a capacitor according to the present invention.

First, as shown in FIG. 2A, an impurity diffusion region 23 is formed in a semiconductor substrate 21. Then a first oxide layer 22 is formed on the semiconductor substrate 21 in which the impurity diffusion region 23 has been formed. Then a nitride layer 24 is formed thereupon. Thereafter, a photo etching process is carried out to remove the nitride layer 24 and the first oxide layer 22 corresponding to the impurity diffusion region 23. Thus, a contact hole 50 is formed in the region where the first oxide layer 22 and the nitride layer 24 have been removed.

Then a first conductive layer 25 is formed on the nitride layer and in the contact hole 50. Here, the first conductive layer is, e.g., doped polysilicon.

Figure 2B:
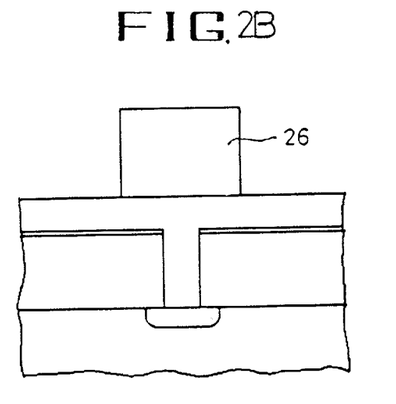

Then, as shown in FIG. 2B, a second oxide layer is deposited on the first conductive layer. Then the second oxide layer is patterned to form a temporary layer pattern 26 on a region where a cylindrical capacitor storage electrode is to be formed (on a portion of the first conductive layer corresponding to the contact hole 50).

Figure 2C:
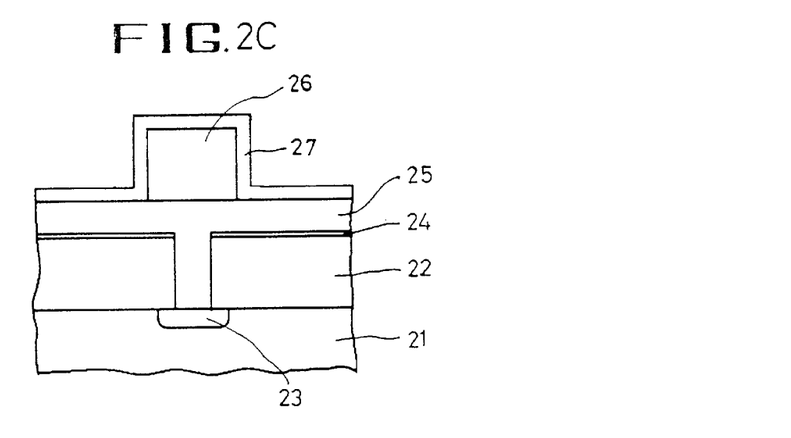

Then, as shown in FIG. 2C, a second conductive layer 27 is formed on the first conductive layer 25 and on the temporary layer pattern 26. Here, the second conductive layer is doped polysilicon.

The above procedures are similar to the conventional method.

Figure 2D:
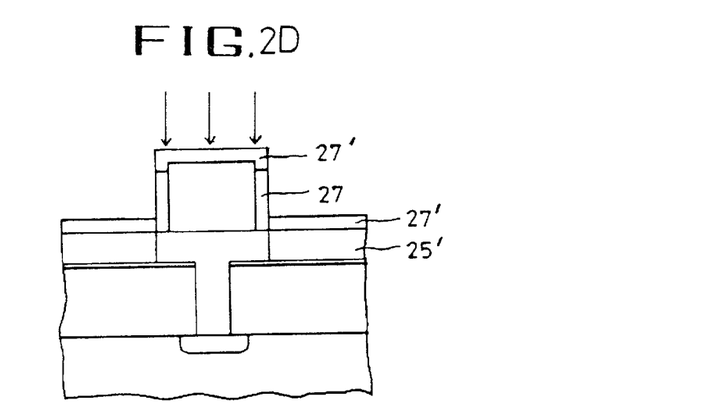

Then, as shown in FIG. 2D, oxygen ions are implanted into the first and second conductive layers excluding a portion of the second conductive layer corresponding to a side of the temporary layer pattern 26. This oxygen ion implantation is carried out in a vacuum, and in the vertical direction relative to the surface of the wafer. The dose of oxygen ions depends upon the thickness of the polysilicon layers. For example, if the first conductive layer 25 and the second conductive layer 27 have a combined thickness of 2000 angstroms, then a High Current Ion Implanter would implant a dose of about $10^{17}$ ions/cm$^2$.

Under this condition, the portion of the second conductive layer which is positioned on the temporary layer pattern receives the oxygen ions, but the portion of the second conductive layer which corresponds to the sides of the temporary layer pattern serves as a mask for the oxygen ion implantation. Therefore, in order to isolate the adjacent elements from each other, the intensity of the oxygen ion implantation is adjusted such that the oxygen ions should reach only the portion of the first conductive layer to be removed and the portion on the top of temporary layer pattern. The depth of the oxygen ion implantation is adjusted such that the oxygen ions should reach only the first conductive layer.

Then a heat treatment is carried out under an inert gas atmosphere including argon or nitrogen to oxidize the oxygen ion implanted conductive layer, thereby forming a silicon oxide layer 27'.

Figure 2E:
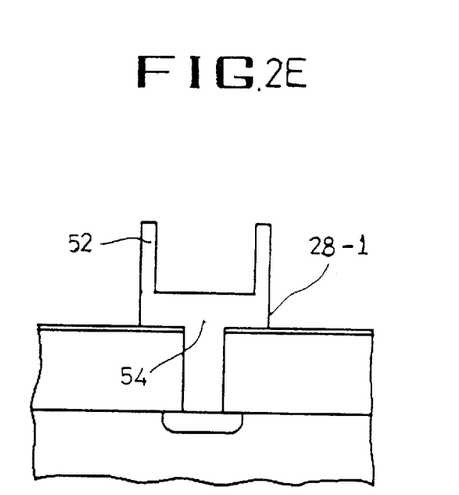

Then, as shown in FIG. 2E, the oxidized portion is etched to form a storage electrode 28-1 of the capacitor. The storage electrode 28-1 has a cylindrical portion 52 having a non-tapered upper end and a contact pole 54 lying below the cylindrical portion 52.

The capacitor which is formed in the above described method has a substantially non-tapered, e.g., rounded, leading end portion, and therefore, even if the capacitor is formed by using a dielectric material having a high dielectric constant, the product reliability is improved.

Figure 2F:
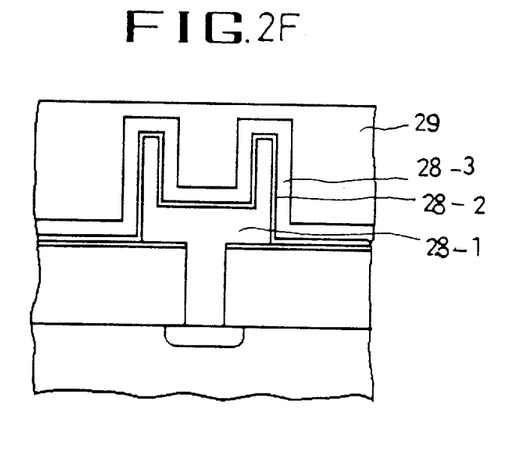

Then, as shown in FIG. 2F, a dielectric layer 28-2 is formed on the surface of the storage electrode 28-1, and then a plate electrode 28-3 as a third conductive layer is formed on the surface of the dielectric layer, thereby completing the formation of the capacitor. Thereafter, post processes such as the deposition of a protecting oxide layer 29 are carried out.

FIGS. 3A–3F are sectional views showing a second embodiment of the present invention.

In this second embodiment, a contact hole is formed in the same manner as that of the above described first embodiment. Then a temporary layer pattern is formed, and then, process steps are carried out up to the step in which a conductive layer is formed upon an oxide layer cylinder. Then before carrying out an oxygen ion implantation, sidewalls, e.g., of an oxide film or a nitride film, are formed along side faces of the conductive layer.

Figure 3A:
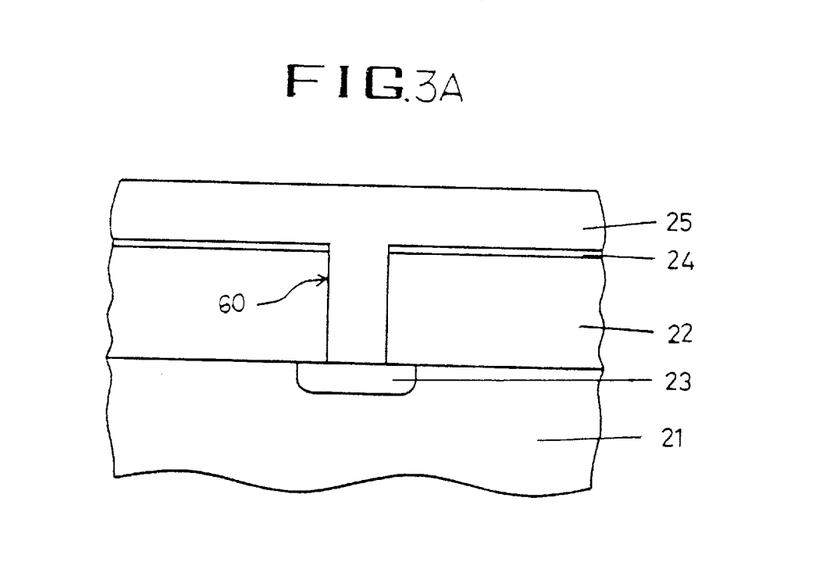
FIGS. 3A–3F are sectional views showing a second embodiment of the present invention.

That is, as shown in FIG. 3A, an impurity diffusion region 23 is formed in a semiconductor substrate 21. Then on the semiconductor substrate with the impurity diffusion region 23 formed therein, there is formed a first oxide layer 22. Then a nitride layer 24 is formed thereupon. Thereafter, a photo etching is carried out to remove the portions of the first oxide layer 22 and the nitride layer 24 corresponding to the impurity diffusion region 23. Thus a contact hole 60 is formed in the region in which the first oxide layer 22 and the nitride layer 24 have been removed.

Then a first conductive layer 25 is formed on the nitride layer and in the contact hole. Here, the first conductive layer is, e.g., doped polysilicon.

Figure 3B:
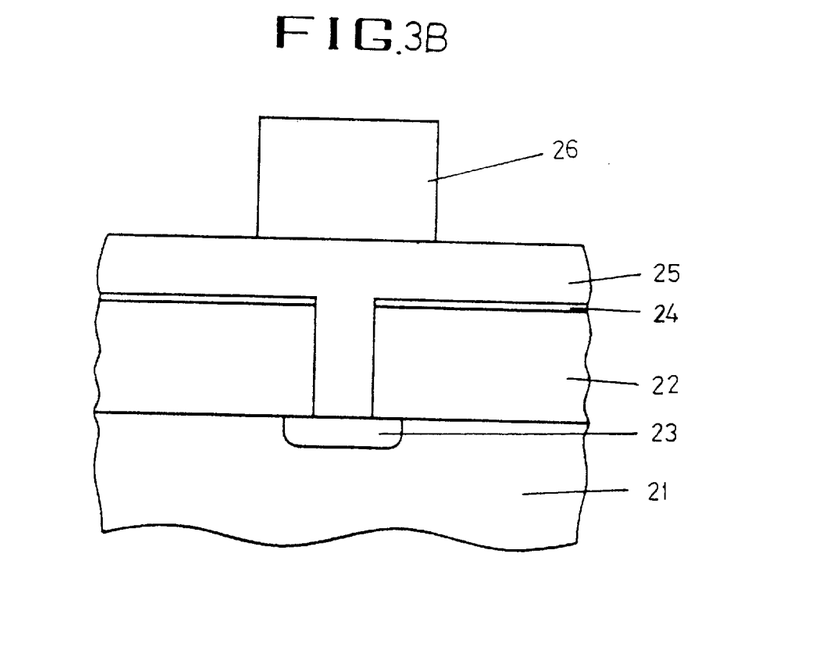

Then, as shown in FIG. 3B, a second oxide layer is deposited upon the first conductive layer, and then, the second oxide layer is patterned to form a temporary layer pattern 26 on a portion where a cylindrical storage electrode of the capacitor is to be formed.

Figure 3C:
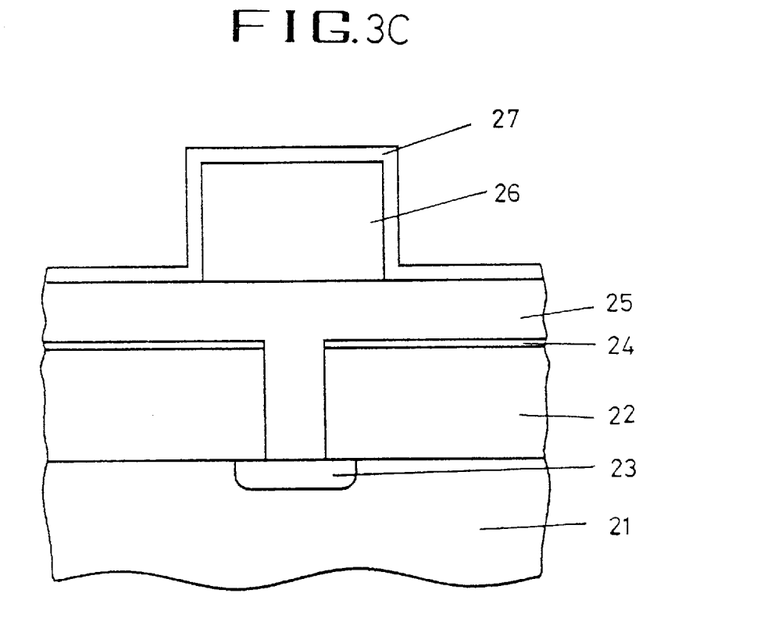

Then, as shown in FIG. 3C, a second conductive layer 27 is formed on the first conductive layer and on the temporary layer pattern 26. Here, the second conductive layer is, e.g., doped polysilicon.

Figure 3D:
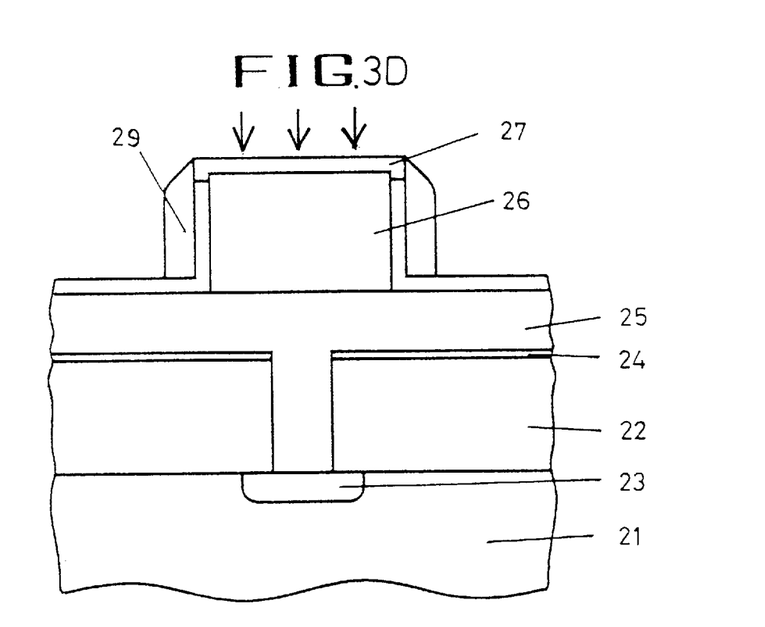

Then, as shown in FIG. 3D, an oxide layer or a nitride layer is deposited on the second conductive layer 27, and then, it is etched back to form a temporary sidewall (sidewall spacer) 29 on the side faces of the second conductive layer around the temporary layer pattern. Then oxygen ions are implanted, and this ion implantation is carried out in a vacuum down to a certain depth.

The ion implanting direction is vertical relative to the surface of the wafer. Thus the oxygen ions are implanted into the second conductive layer which lies on the top of the temporary layer pattern 26, but the oxygen ions are not implanted into the portion of the second conductive layer which lies on the sides of the temporary layer pattern.

In order to isolate the adjacent elements from each other, the ion implantation intensity is adjusted such that the portion of the first conductive layer to be removed and the conductive layer lying on the top of the temporary pattern should be ion-implanted.

Then a heat treatment is carried out under an inert gas atmosphere including argon or nitrogen to oxidize the oxygen ion implanted conductive layer, thereby forming a silicon oxide layer.

Thus, the oxygen ions are not implanted below the sidewall spacer, and therefore, an oxidation does not occur beneath the sidewall spacer. As a result, removal of the first conductive layer under the sidewall spacer does not occur during the etching of the oxide layer. Therefore, the cylindrical portion of the storage electrode and the contact pole lying below are not broken during the etching of the oxide layer, with the result that the reliability of the product is improved.

Figure 3E:
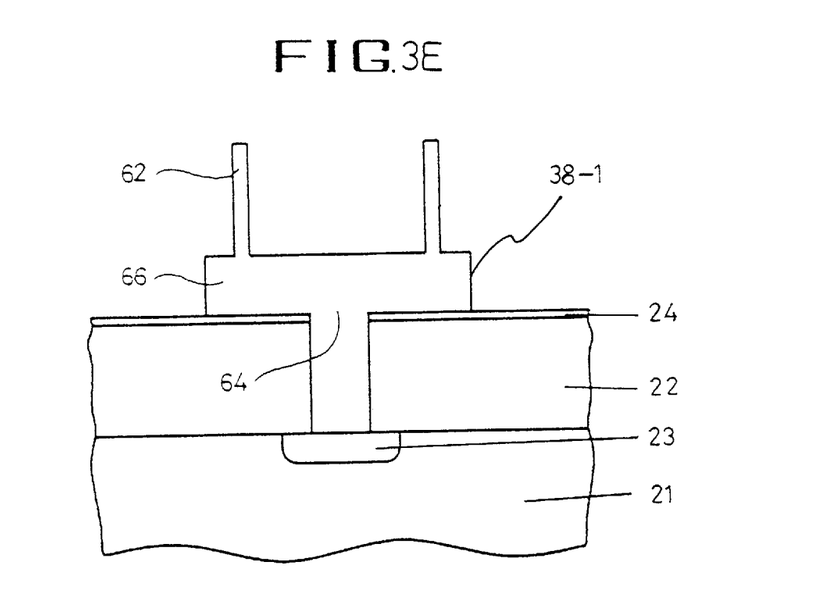

Then as shown in FIG. 3E, the oxidized portion is etched to form a storage electrode 38-1 of the capacitor. The storage 38-1 has an upper cylindrical portion 62 having a non-tapered upper end and a contact pole 64 lying below the cylindrical portion 62. The storage electrode 38-1 also has shoulder portions 66 lying beneath the sidewall spacers 29. The shoulder portions 66 increase the surface area of the storage electrode 38-1.

The capacitor which is formed in the above described method has a substantially non-tapered leading end portion. Therefore, even if the capacitor is formed by using a dielectric material having a high dielectric constant, the product reliability is improved.

Figure 3F:
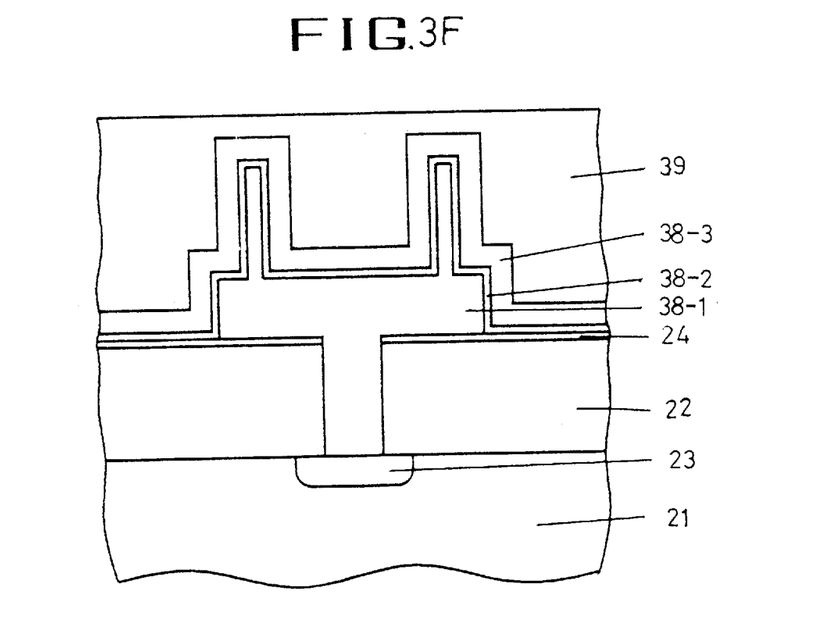

Then as shown in FIG. 3F, a dielectric layer 38-2 is formed on the surface of the storage electrode 38-1, and then a plate electrode 38-3 as a third conductive layer is formed on the surface of the dielectric layer, thereby completing the formation of the capacitor. Thereafter, post processes such as the deposition of a protecting oxide layer 39 are carried out.

In this second embodiment, even if the oxygen ions are diffused sideward, the sidewall spacer prevents the oxygen ions from reaching the conductive layer positioned against the sidewall of the temporary structure 26.

According to the present invention as described above, the substantially non-tapered leading end portions of the cylinder can be formed. Therefore, even when the capacitor is formed by using a high dielectric constant material, the product reliability can be improved.

Therefore, in manufacturing the capacitor, the process becomes simplified, and the reliability is improved. Further, a high dielectric constant material can be used so as to manufacture a high density DRAM device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for formation of a capacitor for a DRAM, comprising the steps of:

providing a substrate;

forming an insulating layer on the substrate;

forming a contact hole through the insulating layer to the substrate;

forming a first conductive layer on said insulating layer and in said contact hole;

forming a temporary layer pattern on a portion of said first conductive layer corresponding to said contact hole;

forming a second conductive layer on said first conductive layer and on said temporary layer pattern;

selectively implanting oxygen ions into said first and second conductive layers except a portion of said second conductive layer corresponding to a side face of said temporary layer pattern;

heat treating to convert oxygen-ion-implanted first and second conductive layer portions into an oxide; removing said oxide and the temporary layer pattern;

forming a dielectric layer on said first and second conductive layers; and forming a third conductive layer on said dielectric layer.

2. The method as claimed in claim 1, wherein said step of selectively implanting oxygen ion includes carrying out an oxygen ion implantation in a vacuum.

3. The method as claimed in claim 1, wherein said steps of forming a first conductive layer and forming a second conductive layer, each includes using doped polysilicon.

4. The method as claimed in claim 1, wherein said step of forming a temporary layer pattern includes:

depositing a silicon oxide layer; and carrying out a photo etching process to etch the silicon oxide layer.

5. The method as claimed in claim 1, wherein the step of selectively implanting oxygen ions includes aiming the ions substantially perpendicularly to a plane defined by the substrate.

6. The method as in claim 1, wherein the step of forming the temporary layer pattern includes shaping the temporary layer pattern substantially into a cylinder.

7. A method for formation of a capacitor for a DRAM, comprising the steps of:

providing a substrate;

forming an insulating layer on the substrate;

forming a contact hole through the insulating layer to the substrate;

forming a first conductive layer on said insulating layer and in said contact hole;

forming a temporary layer pattern on a portion of said first conductive layer corresponding to said contact hole;

forming a second conductive layer on said first conductive layer and on said temporary layer pattern;

forming a temporary sidewall spacer on a sidewall of said second conductive layer corresponding to a side face of said temporary layer pattern;

selectively implanting oxygen ions into exposed portions of said second conductive layer and into said first conductive layer lying thereunder, respectively;

heat treating so as to convert said oxygen-ion-implanted first and second conductive layer portions into an oxide;

removing said oxide and the temporary layer pattern;

forming a dielectric layer on surfaces of said first and second conductive layers; and forming a third conductive layer on said dielectric layer.

8. The method as claimed in claim 7, wherein said step of selectively implanting oxygen includes carrying out an oxygen ion implantation in a vacuum.

9. The method as claimed in claim 7, wherein said steps of forming a first conductive layer and forming a second conductive layer, each includes using doped polysilicon.

10. The method as claimed in claim 7, wherein said step of forming a temporary layer pattern includes:

depositing a silicon oxide layer; and carrying out a photo etching process to etch the silicon oxide layer.

11. The method as claimed in claim 7, wherein said step of forming a temporary sidewall spacer on the sidewall of said second conductive layer includes:

depositing silicon oxide; and etching back the silicon oxide.

12. The method as claimed in claim 7, wherein the step of selectively implanting oxygen ions includes aiming the ions substantially perpendicularly to a plane defined by the substrate.

13. The method as claimed in claim 7, wherein the step of forming the temporary layer pattern includes shaping the temporary layer pattern substantially into a cylinder.

* * * * *